United States Patent
Matsubara

(10) Patent No.: US 8,802,562 B2
(45) Date of Patent: Aug. 12, 2014

(54) SEMICONDUCTOR DEVICE INCLUDING COPPER WIRING AND VIA WIRING HAVING LENGTH LONGER THAN WIDTH THEREOF AND METHOD OF MANUFACTURING THE SAME

(71) Applicant: Renesas Electronics Corporation, Kawasaki (JP)

(72) Inventor: Yoshihisa Matsubara, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/067,472

(22) Filed: Oct. 30, 2013

(65) Prior Publication Data
US 2014/0057432 A1 Feb. 27, 2014

Related U.S. Application Data

(63) Continuation of application No. 12/068,712, filed on Feb. 11, 2008, now abandoned.

(30) Foreign Application Priority Data

Feb. 19, 2007 (JP) .................. 2007-038361

(51) Int. Cl.
*H01L 21/4763* (2006.01)
(52) U.S. Cl.
USPC ........... 438/637; 438/622; 438/629; 438/638; 257/E23.145; 257/758; 257/774
(58) Field of Classification Search
CPC .................................................. H01L 21/76816
USPC ........... 257/E23.145, E21.579, E21.585, 741, 257/750, 751, 758, 774–776; 438/118, 280, 438/619, 622, 629, 637–640, 652, 667, 668, 438/672, 675, 700, 701, 713, 978
See application file for complete search history.

(56) References Cited

U.S. PATENT DOCUMENTS

| | | | |
|---|---|---|---|
| 5,966,634 A | 10/1999 | Inohara et al. | 438/687 |
| 6,482,656 B1 * | 11/2002 | Lopatin | 438/2 |
| 6,677,236 B2 | 1/2004 | Umemura | 438/667 |
| 6,717,267 B1 * | 4/2004 | Kunikiyo | 257/758 |
| 6,779,167 B2 * | 8/2004 | Igarashi et al. | 257/774 |
| 6,812,574 B2 * | 11/2004 | Tomita et al. | 257/773 |

(Continued)

FOREIGN PATENT DOCUMENTS

JP 2002-124575 A 4/2002
JP 2005-327898 A 11/2005

*Primary Examiner* — Chris Chu
(74) *Attorney, Agent, or Firm* — McGinn IP Law Group, PLLC

(57) ABSTRACT

A method for manufacturing a semiconductor device includes forming a first interconnect over the semiconductor substrate; forming an interlayer dielectric film over the first interconnect; forming a hole in the interlayer dielectric film such that the hole reaches the first interconnect; forming a trench in the interlayer dielectric film; and embedded a conductive film in the hole and the trench, thereby a via is formed in the hole and a second interconnect in the trench, wherein, in a planar view, the first interconnect extends in a first direction, wherein, in a planar view, the second interconnect extends in a second direction which is perpendicular to the first direction, and wherein a maximum width of the via in the second direction is larger than a maximum width of the via in the first direction.

10 Claims, 14 Drawing Sheets

(56) References Cited

U.S. PATENT DOCUMENTS

| | | | |
|---|---|---|---|
| 6,826,742 B2 * | 11/2004 | Maeno et al. | 716/130 |
| 7,042,099 B2 | 5/2006 | Kurashima et al. | 257/774 |
| 7,087,516 B2 * | 8/2006 | Hau-Riege | 438/622 |
| 7,134,111 B2 * | 11/2006 | Nakamoto | 257/774 |
| 7,208,831 B2 * | 4/2007 | Fukazawa | 257/700 |
| 7,365,431 B2 * | 4/2008 | Matsubara | 257/758 |
| 7,470,613 B2 * | 12/2008 | Agarwala et al. | 438/627 |
| 7,504,731 B2 * | 3/2009 | Wang | 257/774 |
| 7,508,022 B2 * | 3/2009 | Amo et al. | 257/296 |
| 7,521,350 B2 * | 4/2009 | Kurashima et al. | 438/618 |
| 7,587,696 B2 * | 9/2009 | Nakamoto | 716/130 |
| 2002/0109235 A1 | 8/2002 | Leiphart | 257/737 |
| 2006/0019485 A1 | 1/2006 | Komai et al. | 434/627 |
| 2007/0052095 A1 | 3/2007 | Torii et al. | 257/737 |
| 2007/0111342 A1 | 5/2007 | Satya et al. | 438/17 |
| 2008/0072203 A1 | 3/2008 | Bergman Reuter et al. | 716/14 |

* cited by examiner

SEMICONDUCTOR DEVICE INCLUDING COPPER WIRING AND VIA WIRING HAVING LENGTH LONGER THAN WIDTH THEREOF AND METHOD OF MANUFACTURING THE SAME

REFERENCE TO RELATED APPLICATION

This application is a Continuation application of U.S. patent application Ser. No. 12/068,712, filed on Feb. 11, 2008, which, in turn, claims priority to Japanese Patent Application 2007-038361, filed on Feb. 19, 2007.

BACKGROUND OF THE INVENTION

1. Field of the Invention

The present invention relates to a semiconductor device and a method of manufacturing the semiconductor device.

2. Description of Related Art

FIGS. 8A and 8B show a sectional view and a plan view, respectively, of a semiconductor device of a related art. In a semiconductor device 100, a lower-layer interconnect 102 and an upper-layer interconnect 104 are connected by a via material or a via wire 106 (thereafter it is simply called a via). The via 106 is buried in a via hole. The via 106 is in contact with an end portion of the upper-layer interconnect 104. Incidentally, in FIGS. 8A and 8B, only the interconnects and the via hole are shown and insulating films on the periphery of the interconnects and the via are omitted.

The upper-layer interconnect 104 and the via 106 are formed by the dual damascene process. That is, after the formation of a trench for the upper-layer interconnect 104 and a hole for the via 106 by etching, the upper-layer interconnect 104 and the via 106 are formed by burying copper in the trench and the hole.

In FIG. 8B, the region where the via 106 is present is indicated by hatch lines. As is apparent from this figure, the via 106 has the shape of a square as plan viewed.

Incidentally, Patent Documents 1 and 2 can be mentioned as related arts.

[Patent Document 1] Japanese Patent Laid-Open No. 2005-327898

[Patent Document 2] Japanese Patent Laid-Open No. 2002-124575

In the dual damascene process, however, during etching there may sometimes occur a relative positional displacement between a trench for an interconnect and a hole for a via, reducing the area of a region where the two overlap. If the area of this region is too small, a burying imperfection occurs when the copper is buried in the above-described trench and hole.

FIG. 9A is an SEM photograph (a plan view) showing the appearance of upper-layer interconnects and via when there is scarcely any positional displacement. On the other hand, FIG. 9B is an SEM photograph showing the appearance of upper-layer interconnects and via when there is a positional displacement of approximately 20 nm. The interconnect width and interconnect intervals of the upper-layer interconnects are both approximately 90 nm. The length of the upper-layer interconnect is approximately 330 nm. The positional relationship between the upper-layer interconnects 112 and the via 114 in these photographs is schematically shown in FIG. 10.

If there is a positional displacement as shown in FIG. 9B, then a void 118 due to a burying imperfection of copper may sometimes occur as shown in FIG. 11. FIG. 11 is an SEM photograph (a sectional view) showing the appearance of the void 118 occurring within the via 114 in the vicinity of a lower-layer interconnect 116.

SUMMARY OF THE INVENTION

A semiconductor device has an interconnect and a via material. The via material is provided under the interconnect and is in contact with an end portion of the interconnect. The interconnect and the via are made of copper as one piece. The via material has a top surface coupled to a bottom surface of the interconnect. Top surface has a first length parallel with a longitudinal direction of the interconnect and a second length parallel with a direction perpendicular to the longitudinal direction, and the first length is larger than the second length.

In this semiconductor device, the via material is formed so as to be elongated in a longitudinal direction of the interconnect. As a result of this, the area of a region where the via and the interconnect overlap is expanded. Therefore, during manufacturing it is possible to ensure a large margin for the relative positional displacement between the trench for the first interconnect and the hole for the via material.

A method of manufacturing a semiconductor device, includes forming, by the dual damascene process, an interconnect and a via material, the via material being provided under the first interconnect and being in contact with an end of the interconnect. The via material is formed to comprise a first length along with a longitudinal direction of the interconnect and a second length along with a direction perpendicular to the longitudinal direction and a maximum length of the first length is larger than a maximum length of the second length.

This manufacturing method can ensure the same effect as described just before.

According to the present invention, a semiconductor device having high reliability and a manufacturing method of such semiconductor device are realized.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENT

Figure 1:
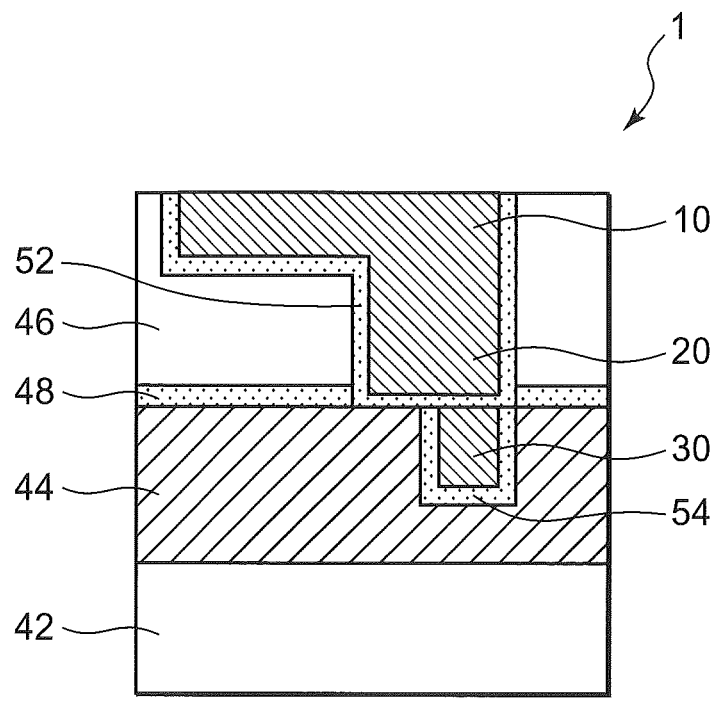
FIG. 1 is a sectional view showing an embodiment of a semiconductor device according to the present invention.

FIG. 1 is a sectional view showing an embodiment of a semiconductor device according to the present invention. A semiconductor device 1 is provided with an interconnect 10 (a first interconnect) and a via 20. An interconnection or an interconnect wiring can be used as the interconnect. In this embodiment, the interconnect 10 is an M2 interconnect, i.e., an interconnect of the second layer from below in the semiconductor device 1. The via 20 is provided under the interconnect 10 and is in contact with an end portion of the interconnect 10.

The interconnect 10 and the via 20 have a dual damascene structure. That is, the interconnect 10 and the via 20 are made of copper as one piece. A barrier metal film 52 is provided so as to collectively cover the interconnect 10 and the via 20. The interconnect 10 and the via 20 are formed in an interlayer dielectric film 46.

An interconnect 30 (a second interconnect) is provided under the via 20. In this embodiment, the interconnect 30 is an M1 interconnect, i.e., an interconnect of the lowest layer in the semiconductor device 1. The interconnect 30 is connected to the interconnect 10 via the via 20. A barrier metal film 54 is provided so as to cover this interconnect 30. The interconnect 30 is formed in an interlayer dielectric film 44. The interlayer dielectric film 44 is formed on a semiconductor substrate 42. The semiconductor substrate 42 is for example a silicon substrate. Between the interlayer dielectric film 44 and the interlayer dielectric film 46 is provided an etching stopper film 48. The etching stopper film 48 is for example an SiCN film.

Figure 2:
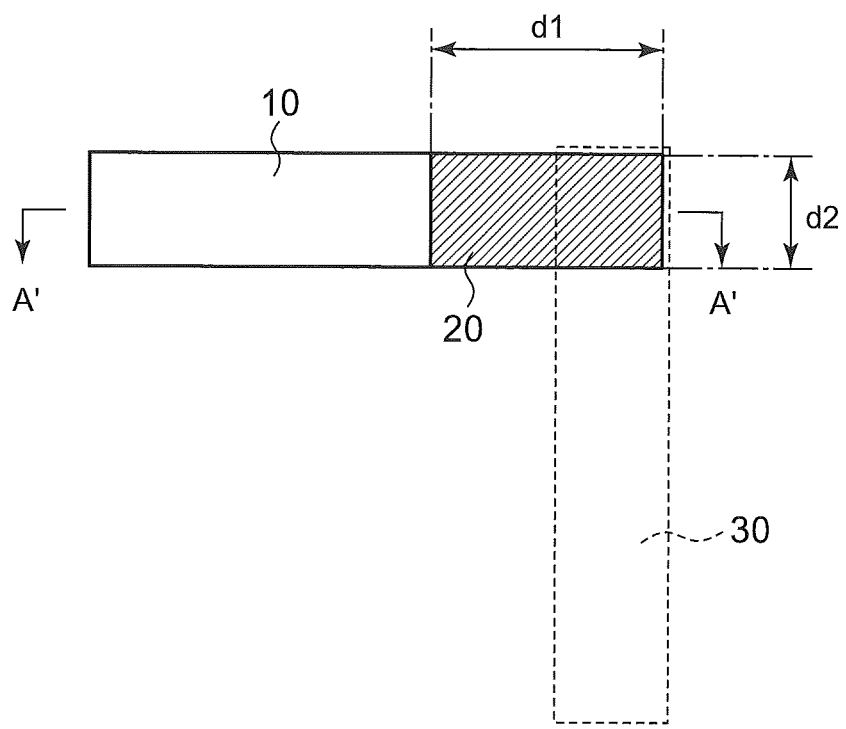
FIG. 2 is a plan view showing interconnects and a via hole in FIG. 1.

FIG. 2 is a plan view showing the interconnects 10, 30 and the via 20 in FIG. 1. FIG. 1 is an A-A' sectional view of FIG. 2. In FIG. 2, an end surface of the via 20 on the interconnect 10 side is indicated by hatch lines. As is apparent from this figure, for the above-described end surface of the via 20, a maximum length d1 in a longitudinal direction (a transverse direction in FIG. 2) of the interconnect 10 is larger than a maximum length d2 in a direction perpendicular to the longitudinal direction. The maximum length d2 is substantially equal to the width of the interconnect 10. Incidentally, FIG. 2 shows an ideal positional relationship between the interconnect 10 and the via 20, i.e., a positional relationship obtained when there is no positional displacement.

In this embodiment, the above-described end surface of the via 20 has the shape of a rectangle having a long side parallel to the longitudinal direction of the interconnect 10. Therefore, the maximum length d1 and the maximum length d2 are equal to the length, respectively, of the long side and short side of the rectangle. The shape of the section of the via 20 parallel to the above-described end surface is substantially constant. That is, the sectional shape of the via 20 is substantially constant regardless of the height from the semiconductor substrate 42.

Figure 3A:
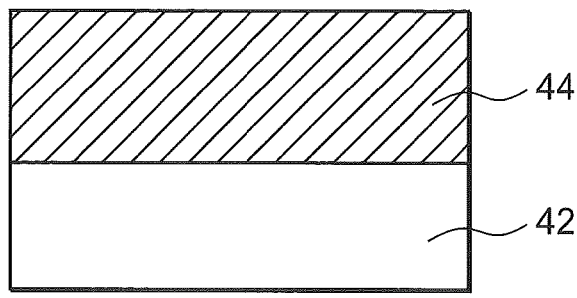
FIGS. 3A to 3L are process drawings showing an embodiment of a manufacturing method of a semiconductor device according to the present invention.
Figure 3B:
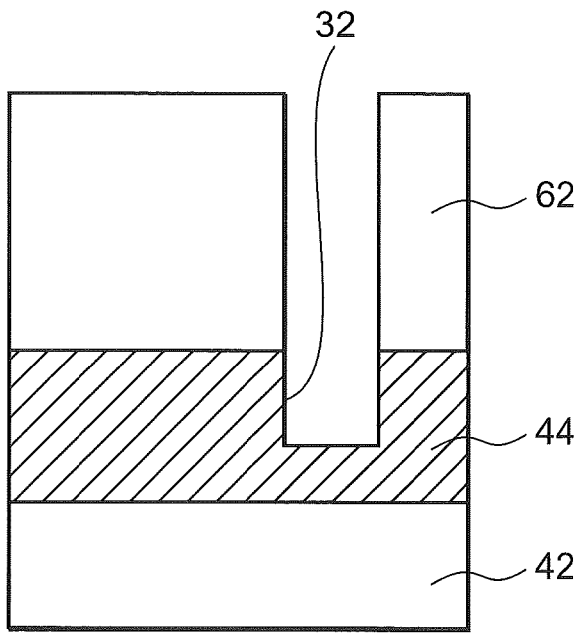
Figure 3C:
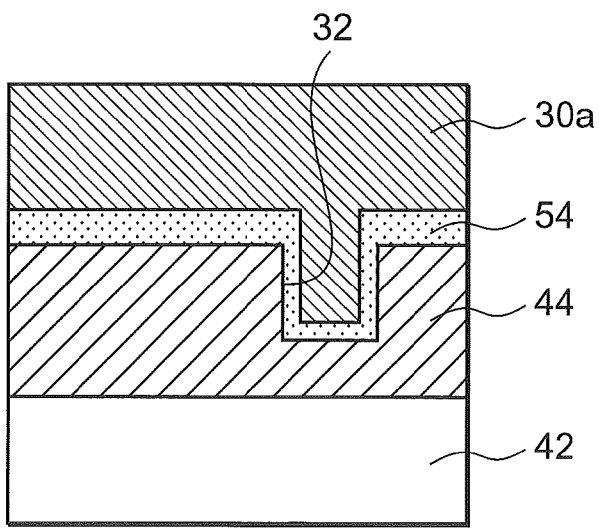

With reference to FIGS. 3A to 3L, a description will be given of an example of a manufacturing method of the semiconductor device 1 as an embodiment of a method of manufacturing a semiconductor device according to the present invention. This method includes a step of forming the interconnect 10 and the via 20 by the dual damascene process. Precisely speaking, first, the interlayer dielectric film 44 is formed on the semiconductor substrate 42 (FIG. 3A). Subsequently, after the application of a resist film 62 to the interlayer dielectric film 44, the resist film 62 is patterned. And by etching the interlayer dielectric film 44 using this resist film 62 as a mask, a trench 32 for the interconnect 30 is formed (FIG. 3A). Subsequently, after the formation of the barrier metal film 54 on the whole surface of the interlayer dielectric film 44, a copper film 30a is formed so as to bury the trench 32 (FIG. 3C).

Figure 3D:
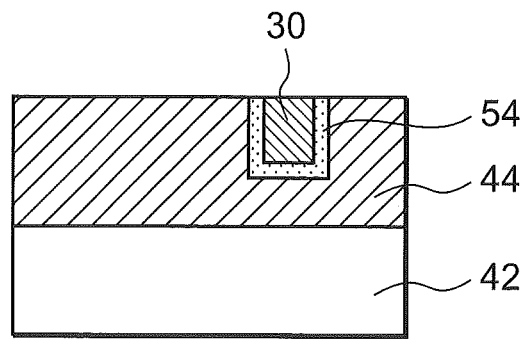
Figure 3E:
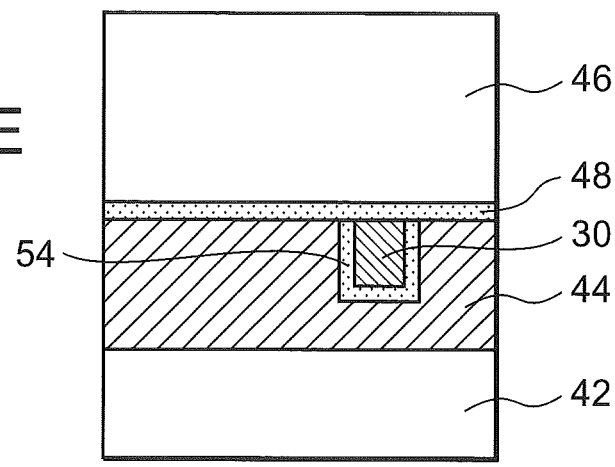
Figure 3F:
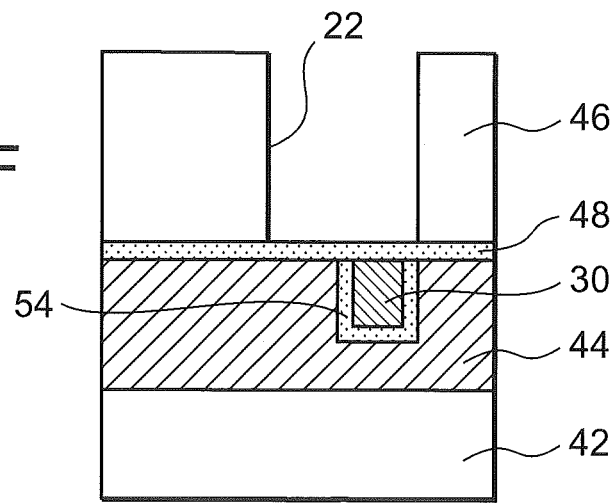

Next, the barrier metal film 54 and copper film 30a that are present outside the trench 32 are removed by CMP (chemical mechanical polishing). As a result of this, the interconnect 30 is formed (FIG. 3D). Next, the interlayer dielectric film 46 is formed above the interlayer dielectric film 44 via the etching stopper layer 48 (FIG. 3E). After that, a hole 22 for the via 20 is formed by selectively etching a prescribed region of the interlayer dielectric film 46 (FIG. 3F). As described above, in this embodiment, the hole 22 for the via 20 is formed before the formation of a trench for the interconnect 10. That is, the via-first process is adopted.

Figure 3G:
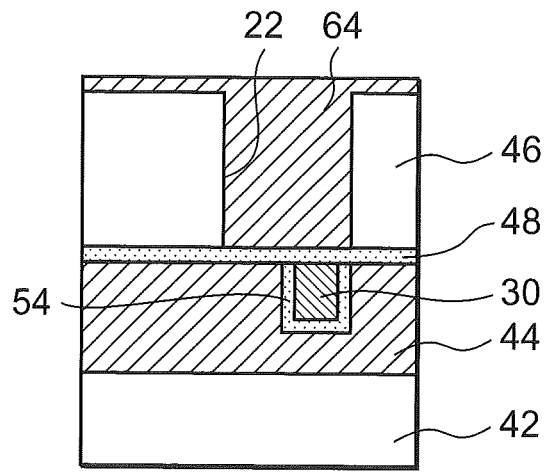
Figure 3H:
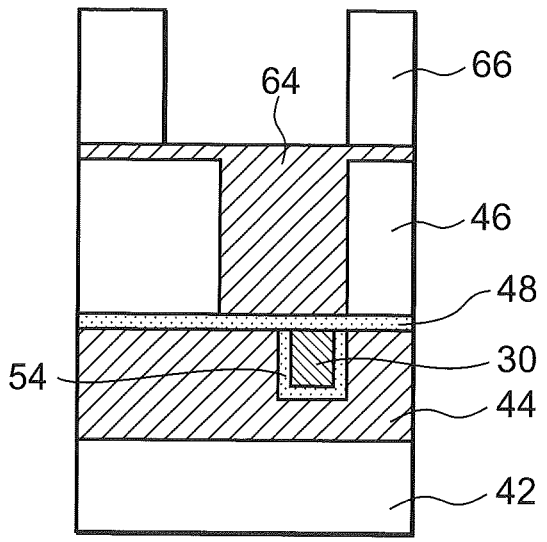
Figure 3I:
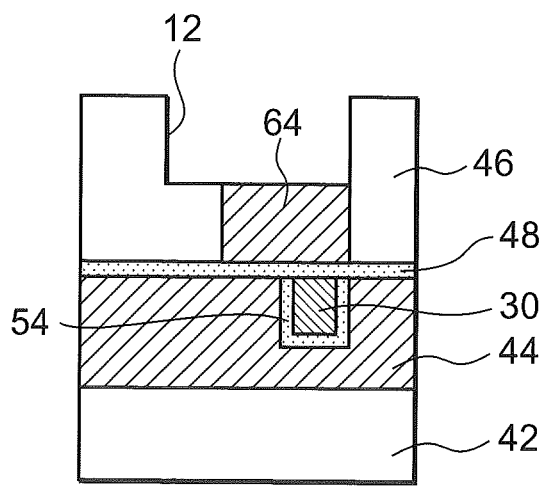
Figure 3J:
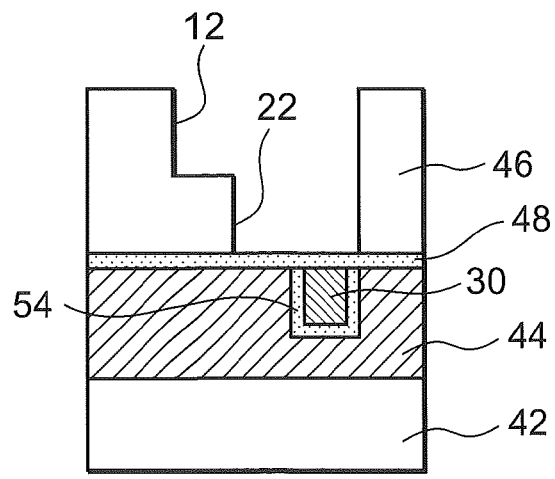

Next, a BARC (bottom anti-reflection coating) film 64 is formed so as to bury the hole 22 (FIG. 3G). Subsequently, after the application of a resist film 66 to the interlayer dielectric film 46, the resist film 66 is patterned (FIG. 3H). And a trench 12 for the interconnect 10 is formed by etching the interlayer dielectric film 46 using this resist film 66 as a mask, and thereafter the resist film 66 is removed (FIG. 3I).

Figure 3K:
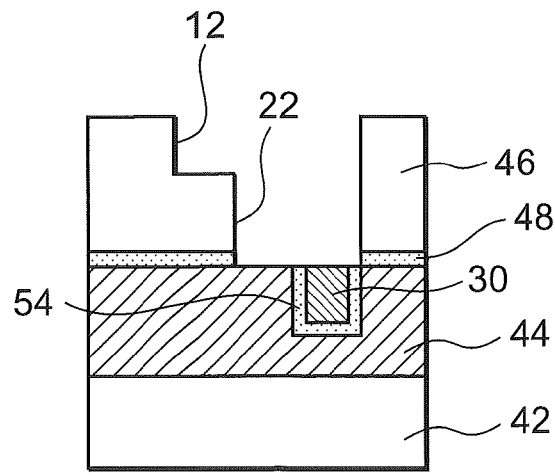
Figure 3L:
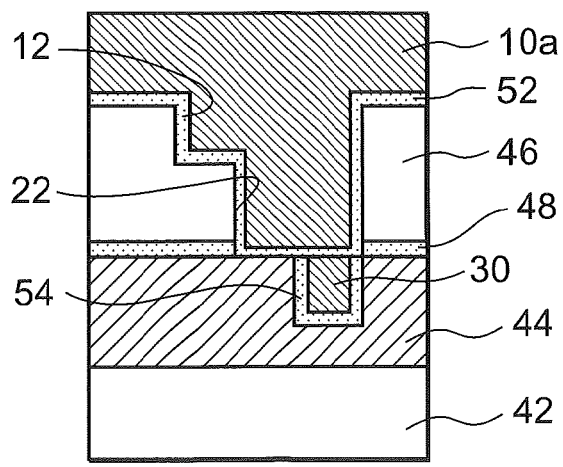

Next, the BARC film 64 remaining within the hole 22 is removed (FIG. 6A). Furthermore, the etching stopper film 48 present in the bottom portion of the hole 22 is removed by etching (FIG. 3K). Subsequently, after the formation of the barrier metal film 52 on the whole surface of the interlayer dielectric film 46, a copper film 10a is formed so as to collectively bury the trench 12 and the hole 22 (FIG. 3L). After that, a barrier metal film 52 and the copper film 10a that are present outside the trench 12 and the hole 22 are removed by CMP. As a result of this, the interconnect 10 and the via 20 are simultaneously formed and the semiconductor device 1 shown in FIG. 1 is obtained.

The advantage of this embodiment will be described. In this embodiment, the end surface of the via 20 on the interconnect 10 side is formed so as to be elongated in the longitudinal direction of the interconnect 10. As a result of this, the area of a region where the via 20 and the interconnect 10 overlap is expanded. Therefore, during manufacturing it is possible to ensure a large margin for a relative positional displacement between the trench 12 for the interconnect 10 and the hole 22 for the via 20. For this reason, the alignment manufacturing limit of dual damascene is improved. The alignment manufacturing limit refers to an upper limit value of the amount of positional displacement that is allowed for ensuring a necessary yield. According to this embodiment, the semiconductor device 1 having high reliability and a manufacturing method of thereof are realized.

Incidentally, from the standpoint of sufficiently expanding the area of a region where the via 20 and the interconnect 10 overlap, it is preferred that the maximum length d1 (see FIG. 2) of the via 20 be not less than twice the maximum length d2.

Furthermore, in this embodiment, the area of the via 20 as plan viewed increases by the amount of elongation of the via 20 in the longitudinal direction of the interconnect 10. As a result of this, the quantity of light that comes in from the mask of the via 20 during exposure increases and, therefore, a lithography margin expands.

The via 20 is in contact with an end portion of the interconnect 10. In this case, even a slight positional displacement results in a reduction of the area of a region where the via 20 and the interconnect 10 overlap. Therefore, the usefulness of this embodiment that enables a large margin for positional displacement to be ensured becomes especially high.

The interconnect 10 and the via 20 are made of copper as one piece. In this case, electric resistance can be reduced compared to a case where a barrier metal film is interposed between the two layers.

The maximum length d2 of the above-described end surface of the via 20 is substantially equal to the width of the interconnect 10. For this reason, when there is no positional displacement, the whole via 20 is to be accommodated under the interconnect 10. As a result of this, it is possible to ensure a sufficient gap between an interconnect in close proximity to the interconnect 10 and the via 20.

Figure 4:
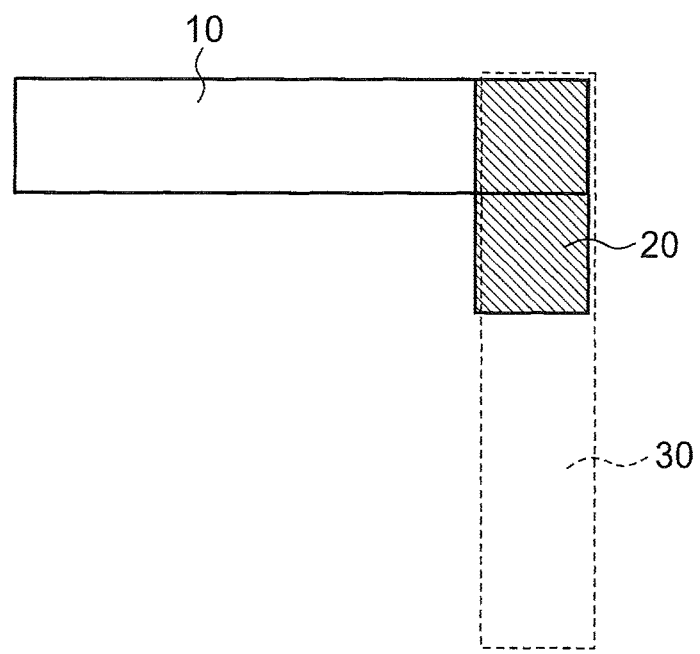
FIG. 4 is a plan view showing a comparative example of the embodiment.

In this connection, as a technique for increasing the area of a region where the via 20 and the interconnect 10 overlap, for example as shown in FIG. 4, it is also conceivable to elongate the above-described end surface of the via 20 in a direction perpendicular to the longitudinal direction of the interconnect 10. This figure shows a plane similar to that of FIG. 2. In this case, however, the via 20 sticks out from under the interconnect 10 and, therefore, the gap between an interconnect in the same layer as the interconnect 10 in close proximity to an interconnect 10 and the via 20 decreases. This produces harmful effects, such as the phenomenon that the interconnect 10 and the above-described interconnect in close proximity thereto cannot be arranged with a minimum gap, and the degree of freedom of design becomes narrow.

The shape of a section of the via 20 parallel to the above-described end surface is substantially constant. In contrast to this, Patent Document 1 discloses a via hole having a protrusion. Concretely, a protrusion is formed in an upper part of the via hole. For this reason, in this via hole, the upper portion provided with the via hole and other portions have different sectional shapes. Therefore, in forming this via hole, it is necessary to perform etching by two stages, resulting in an increase in the number of manufacturing steps. In addition, it becomes necessary to perform the control of etching depth and hence process control becomes difficult. Moreover, because it becomes necessary to use two masks for this etching, the cost of manufacturing also rises. In this respect, according to this embodiment, it is possible to form the hole 22 for the via 20 by single-stage etching, and therefore, these problems can be avoided.

The interconnect 10 and the via 20 are formed by the via-first process. In contrast to this, in the case of the trench-first process, that is, when the trench 12 for the interconnect 10 is formed before the formation of the hole 22 for the via 20, it is difficult to pattern the resist film for the via 20 as desired. This is because the resist film is formed on a rough surface (the bottom surface of the trench 12). In this respect, according to the via-first process, the patterning of the resist film for the via 20 becomes easy and, therefore, the via 20 can be satisfactorily formed.

Incidentally, in the 65-nm generation and beyond (the minimum interconnect width is not more than 65 nm), the above-described problem, i.e., the problem of the burying imperfection of copper in the dual damascene process becomes more conspicuous. Therefore, the usefulness of this embodiment that enables a large margin for positional displacement to be ensured becomes especially high. According to this embodiment, even in the 65-nm generation and beyond, it is possible to satisfactorily perform the formation of the interconnect 10 and the via 20 by the dual damascene process without the introduction of an expensive lithography device.

The present invention is not limited to the above-described embodiment but various modifications are possible. In the above-described embodiment, the case where the planar shape of the interconnects 10, 30 and the via 20 is rectangular was shown as an example. However, the planar shape of these may also be shapes other than the rectangle.

Figure 5:
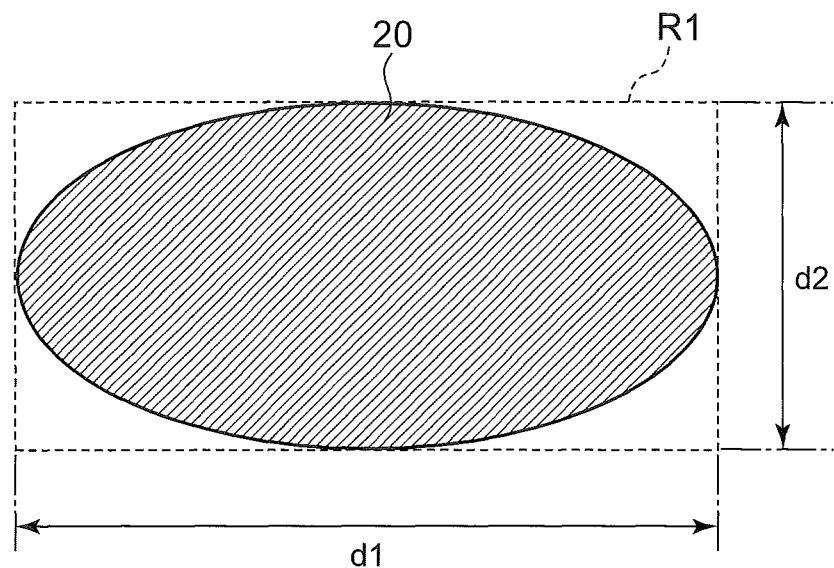
FIG. 5 is a plan view to explain a modification of the embodiment.
Figure 8A:
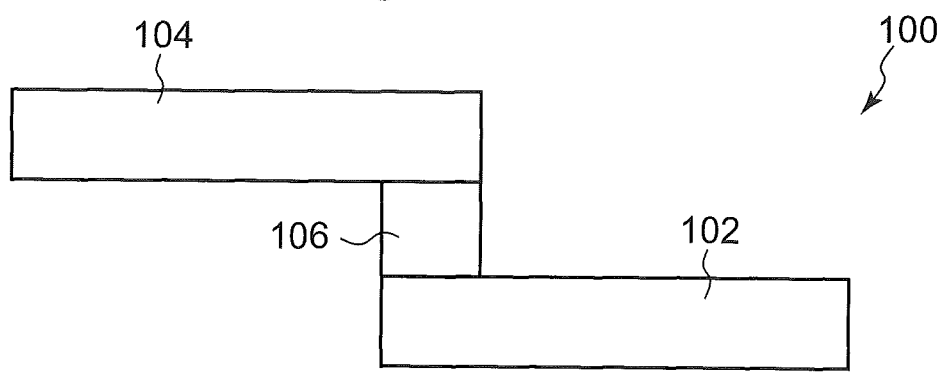
FIGS. 8A and 8B are a sectional view and a plan view, respectively, of a semiconductor device of a related art.
Figure 8B:
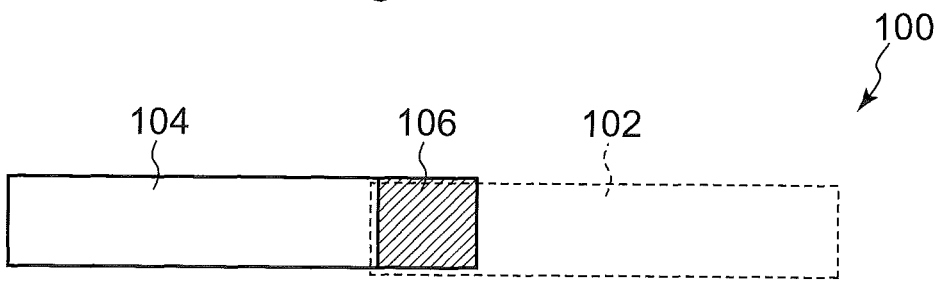
Figure 9A:
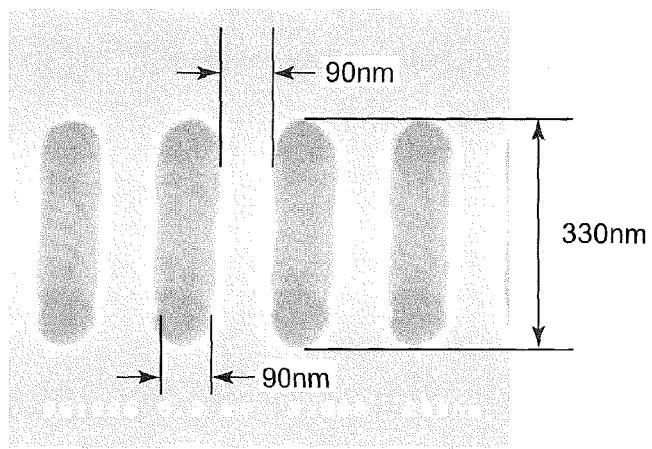
FIGS. 9A and 9B are SEM photographs to explain a problem of the related art.
Figure 9B:
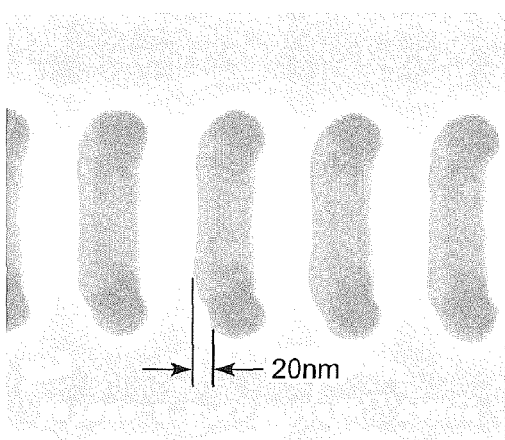
Figure 10:
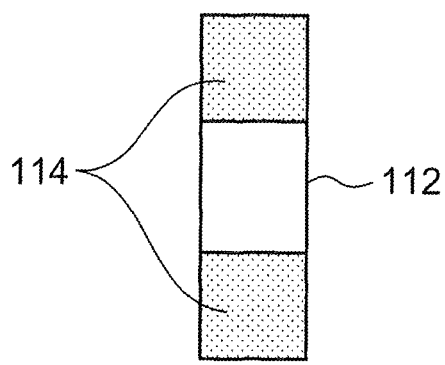
FIG. 10 is a plan view to explain a problem of the related art.
Figure 11:
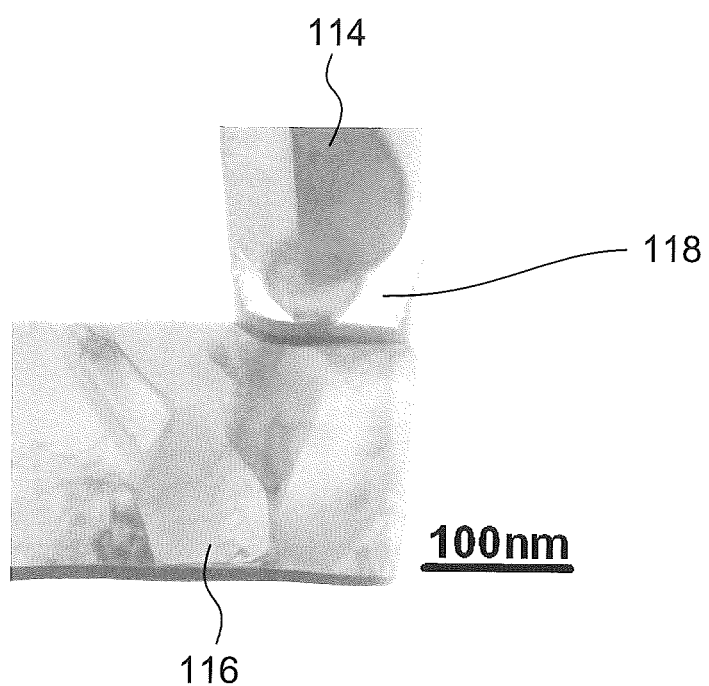
FIG. 11 is an SEM photograph to explain a problem of the related art.

When the planar shape of the via 20 (the shape of the end surface on the interconnect 10 side) is not rectangular, the maximum length d1 in the longitudinal direction of the interconnect 10 and the maximum length d2 in a direction perpendicular to this longitudinal direction are defined as follows. That is, as shown in FIG. 8, the lengths of the sides of a rectangle capable of including the above-described end surface of the via 20, which has the smallest area (the rectangle R1), become the above-described maximum length d1, d2. However, it is defined that the rectangle R1 has a side parallel to the longitudinal direction (the transverse direction in FIG. 5) of the interconnect 10, and the length of a side parallel to the longitudinal direction is the maximum length d1 and the length of a side perpendicular to the longitudinal direction is the maximum length d2.

Figure 6:
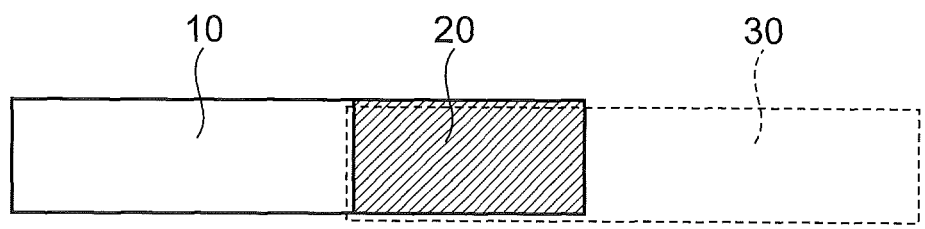
FIG. 6 is a plan view to explain a modification of the embodiment.

In the above-described embodiment, the case where the longitudinal direction of the interconnect 10 and the longitudinal direction of the interconnect 30 are perpendicular to each other was shown as an example. As shown in FIG. 6, however, these longitudinal directions may also be parallel to each other.

Figure 7:
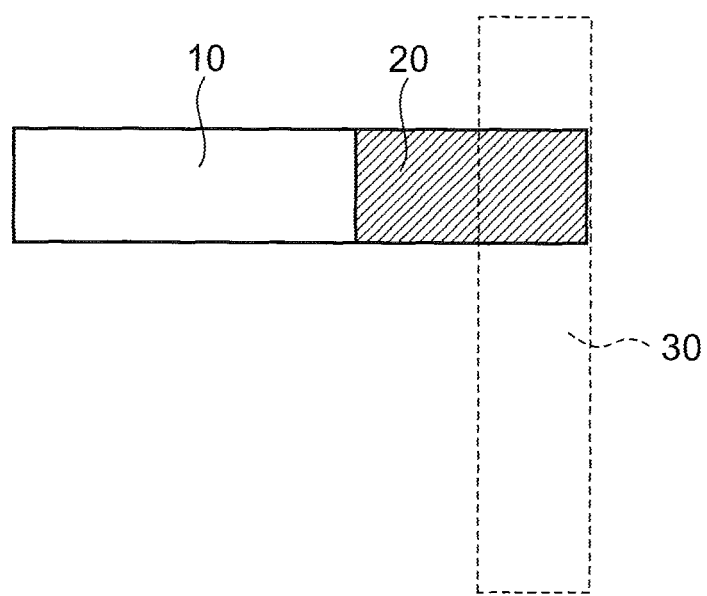
FIG. 7 is a plan view to explain a modification of the embodiment.

In the above-described embodiment, the case where the via 20 is in contact with the end portion of the interconnect 30 was shown as an example. As shown in FIG. 7, however, the via 20 may also be in contact with the middle part of the interconnect 30 (a portion other than the end portion).

The present invention has been described based on the above examples, but the present invention is not limited only to the above examples, and includes various kinds of alterations and modifications that could be achieved by a person skilled in the art within the scope of the invention of each of claims of this application as a matter of course.

Further, it is noted that, applicant's intent is to encompass equivalents of all claim elements, even if amended later during prosecution.

The invention claimed is:

1. A method for manufacturing a semiconductor device comprising:
   (a) forming a first interconnect over the semiconductor substrate;
   (b) forming an interlayer dielectric film over the first interconnect;
   (c) forming a hole in the interlayer dielectric film such that the hole reaches the first interconnect;
   (d) forming a trench in the interlayer dielectric film; and
   (e) embedding a conductive film in the hole and the trench, thereby a via is formed in the hole and a second interconnect in the trench,
   wherein, in a planar view, the first interconnect extends in a first direction,
   wherein, in a planar view, the second interconnect extends in a second direction which is perpendicular to the first direction, and
   wherein a maximum width of the via in the second direction is larger than a maximum width of the via in the first direction.

2. A method for manufacturing a semiconductor device according to the claim 1,
   wherein the maximum width of the via in the second direction is larger than a width of the via in the first interconnect in the second direction.

3. A method for manufacturing a semiconductor device according to the claim 1, wherein the maximum width of the via in the first direction is the same width as the second interconnect in the first direction.

4. A method for manufacturing a semiconductor device according to the claim 1,
wherein the maximum width of the via in the second direction is twice or more than the maximum width of the via in the first direction.

5. A method for manufacturing a semiconductor device according to the claim 1,
wherein the forming the hole in the interlayer dielectric film is performed by using a first resist film as a mask.

6. A method for manufacturing a semiconductor device according to the claim 5,
wherein the forming the trench is performed by using a second resist film as a mask.

7. A method for manufacturing a semiconductor device according to the claim 1, wherein the embedding the conductive film includes:

(e1) forming the conductive film in the hole and the trench and over the interlayer dielectric film; and (e2) polishing the conductive film formed over the interlayer dielectric film by a CMP method.

8. A method for manufacturing a semiconductor device according to the claim 1,
wherein the forming the trench is performed after the forming the hole in the interlayer dielectric film.

9. A method for manufacturing a semiconductor device according to the claim 1,
wherein the conductive film includes a copper film.

10. A method for manufacturing a semiconductor device according to the claim 9,
wherein a barrier metal film is formed between the conductive film and the interlayer dielectric film and between the conductive film and the first interconnect.

* * * * *